(12) United States Patent
He et al.

(10) Patent No.: US 11,471,948 B2
(45) Date of Patent: Oct. 18, 2022

(54) COATED TOOL AND CUTTING TOOL INCLUDING SAME

(71) Applicant: KYOCERA CORPORATION, Kyoto (JP)

(72) Inventors: Dan He, Saitama (JP); Tsuyoshi Yamasaki, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 252 days.

(21) Appl. No.: 16/651,380

(22) PCT Filed: Sep. 26, 2018

(86) PCT No.: PCT/JP2018/035617
§ 371 (c)(1),
(2) Date: Mar. 27, 2020

(87) PCT Pub. No.: WO2019/065707
PCT Pub. Date: Apr. 4, 2019

(65) Prior Publication Data
US 2020/0298318 A1   Sep. 24, 2020

(30) Foreign Application Priority Data

Sep. 27, 2017   (JP) .............................. JP2017-186548

(51) Int. Cl.
*B23B 27/14*   (2006.01)
*C23C 14/14*   (2006.01)
(Continued)

(52) U.S. Cl.
CPC ............ *B23B 27/148* (2013.01); *C23C 14/14* (2013.01); *C23C 14/24* (2013.01); *C23C 14/34* (2013.01); *C23C 28/42* (2013.01)

(58) Field of Classification Search
CPC ........ B23B 27/14; B23B 27/148; C23C 28/42
(Continued)

(56) References Cited

U.S. PATENT DOCUMENTS 5,558,789 A * 9/1996 Singh ...................... C04B 41/53
427/307
6,025,076 A * 2/2000 Collins ............... C23C 16/0227
428/408
(Continued)

FOREIGN PATENT DOCUMENTS

CN     101209611 A    7/2008
CN     102917822 A    2/2013
(Continued)

OTHER PUBLICATIONS

Internet Archive of "Fixed Blade Utility Knife" on sale at Home Depot, Mar. 31, 2015 (Year: 2015).

*Primary Examiner* — Archene A Turner
(74) *Attorney, Agent, or Firm* — Viering, Jentschura & Partner MBB

(57) ABSTRACT

A coated tool may include a base member and a coating layer located on the base member. The coating layer may include a first section located on the base member and a second section located on the first section. The first section may include an AlTi portion including aluminum and titanium, and an AlCr portion including aluminum and chromium, and each of the AlTi portion and the AlCr portion may be in contact with the base member. The second section may include a plurality of AlTi layers including aluminum and titanium, and a plurality of AlCr layers including aluminum and chromium, and the AlTi layers and the AlCr layers may be located alternately one upon another.

9 Claims, 6 Drawing Sheets

(51) Int. Cl.
*C23C 14/24* (2006.01)
*C23C 14/34* (2006.01)
*C23C 28/00* (2006.01)

(58) Field of Classification Search
USPC ........................................................ 428/697
See application file for complete search history.

(56) References Cited

U.S. PATENT DOCUMENTS

| | | | |
|---|---|---|---|
| 6,103,357 A | 8/2000 | Selinder et al. | |
| 8,993,095 B2* | 3/2015 | Ishida | C23C 30/005 |
| | | | 428/213 |
| 2007/0087211 A1* | 4/2007 | Endres | C23C 28/046 |
| | | | 427/299 |
| 2008/0166583 A1 | 7/2008 | Astrand | |
| 2008/0166588 A1 | 7/2008 | Astrand | |
| 2013/0071620 A1 | 3/2013 | Waki et al. | |
| 2015/0231703 A1* | 8/2015 | Bjormander | C23C 16/0263 |
| | | | 407/115 |
| 2015/0328690 A1 | 11/2015 | Sakamoto | |
| 2017/0009352 A1 | 1/2017 | Kubo et al. | |
| 2019/0040519 A1 | 2/2019 | Sato et al. | |
| 2019/0247930 A1 | 8/2019 | Tanaka et al. | |
| 2020/0189007 A1 | 6/2020 | He et al. | |
| 2020/0222989 A1 | 7/2020 | He et al. | |
| 2020/0298315 A1 | 9/2020 | He et al. | |

FOREIGN PATENT DOCUMENTS

| | | |
|---|---|---|
| CN | 104349855 A | 2/2015 |
| CN | 105792967 A | 7/2016 |
| JP | 2001521447 A | 11/2001 |
| JP | 2008162009 A | 7/2008 |
| JP | 2011011286 A | 1/2011 |
| JP | 2014091169 A | 5/2014 |
| JP | 2017042906 A | 3/2017 |
| KR | 20130098861 A | 9/2013 |
| WO | 2018100849 A1 | 6/2018 |
| WO | 2019044714 A1 | 3/2019 |
| WO | 2019044715 A1 | 3/2019 |

* cited by examiner

COATED TOOL AND CUTTING TOOL INCLUDING SAME

CROSS-REFERENCE TO RELATED APPLICATIONS

This application is a national stage entry according to 35 U.S.C. 371 of PCT Application No. PCT/JP2018/035617 filed on Sep. 26, 2018, which claims priority to Japanese Application No. 2017-186548 filed on Sep. 27, 2017, which are entirely incorporated herein by reference.

TECHNICAL FIELD

The present disclosure relates to a coated tool for use in a cutting process, and a cutting tool including the coated tool.

BACKGROUND

As a coated tool for use in a cutting process, such as a turning process and a milling process, a surface coated cutting tool (coated tool) has been discussed, for example, in Japanese Unexamined Patent Publication No. 2017-042906 (Patent Document 1). The coated tool discussed in Patent Document 1 may include a tool base member and a hard coating layer in which an A layer represented by $(Ti_{1-z}Al_z)N$ and a B layer represented by $(Cr_{1-x-y}Al_xM_y)N$ may be laminated alternately one upon another on a surface of the tool base member. Only one of the A layer and the B layer may be in contact with the surface of the tool base member.

SUMMARY

A coated tool according to a non-limiting aspect of the present disclosure may include a base member and a coating layer located on the base member. The coating layer may include a first section located on the base member and a second section located on the first section. The first section may include an AlTi portion including aluminum and titanium, and an AlCr portion including aluminum and chromium, and each of the AlTi portion and the AlCr portion may be in contact with the base member. The second section may include a plurality of AlTi layers including aluminum and titanium, and a plurality of AlCr layers including aluminum and chromium, the AlTi layers and the AlCr layers may be located alternately one upon another.

A cutting tool according to a non-limiting aspect of the present disclosure may include a holder including a pocket located at a side of a front end of the holder, and in another non-limiting aspect of the present disclosure, the above coated tool may be located in the pocket.

DETAILED DESCRIPTION

<Coated Tool>

Figure 1:
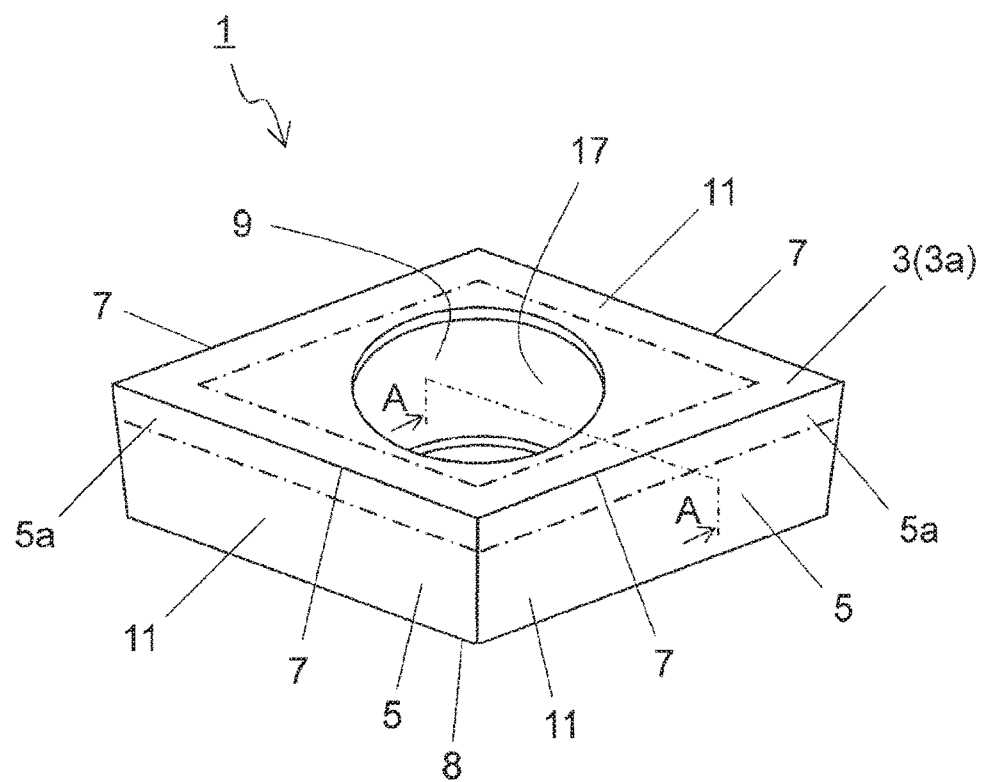
FIG. 1 is a perspective view illustrating a coated tool in a first non-limiting embodiment of the present disclosure.

Coated tools in various non-limiting embodiments of the present disclosure are described in detail below with reference to the drawings. For the sake of description, the drawings referred to in the following illustrate, in a simplified form, only main members necessary for describing the various non-limiting embodiments. The coated tools are therefore capable of including any arbitrary structural member not illustrated in the drawings referred to. Sizes of the members in each of the drawings faithfully represent neither sizes of actual structural members nor size ratios of these members. These are also true for a cutting tool described later.

First Non-Limiting Embodiment

A coated tool 1 in a first non-limiting embodiment has a quadrangular plate shape and includes a first surface 3 (upper surface in FIG. 1) having a quadrangular shape, a second surface 5 (side surface in FIG. 1), and a cutting edge 7 located on at least a part of a ridge line where the first surface 3 intersects with the second surface 5. The coated tool 1 in the first non-limiting embodiment further includes a third surface 8 (lower surface in FIG. 1) having a quadrangular shape.

The entirety of an outer periphery of the first surface 3 may serve as the cutting edge 7 in the coated tool 1 of the first non-limiting embodiment. The coated tool 1 is not limited to the above configuration. For example, the cutting edge 7 may be located on only one side or a part of the first surface 3 having the quadrangular shape.

The first surface 3 may at least partially include a rake surface region 3a. A region in the first surface 3 which is located along the cutting edge 7 serves as the rake surface region 3a in the first non-limiting embodiment. The second surface 5 may include at least partially a flank surface region 5a. A region in the second surface 5 which is located along the cutting edge 7 serves as the flank surface region 5a in the first non-limiting embodiment. In other words, the cutting edge 7 is located on an intersecting part of the rake surface region 3a and the flank surface region 5a.

In FIG. 1, a boundary between the rake surface region 3a and other region on the first surface 3 is indicated by a chain line. A boundary between the flank surface region 5a and other region on the second surface 5 is indicated by a chain line. FIG. 1 illustrates a non-limiting embodiment in which the coating layer 11 is located on the entirety of the first surface 3 including the rake surface region 3a and on the entirety of the second surface 5 including the flank surface region 5a, and the coating layer 11 is located along a ridge line where at least the first surface 3 intersects with the second surface 5. Therefore, the chain line indicating the boundary on the first surface 3 is ring-shaped.

A size of the coated tool 1 is not particularly limited. For example, a length of one side of the first surface 3 is settable to approximately 3-20 mm in the first non-limiting embodiment. A height from the first surface 3 to the third surface 8 located on an opposite side of the first surface 3 is settable to approximately 5-20 mm.

Figure 2:
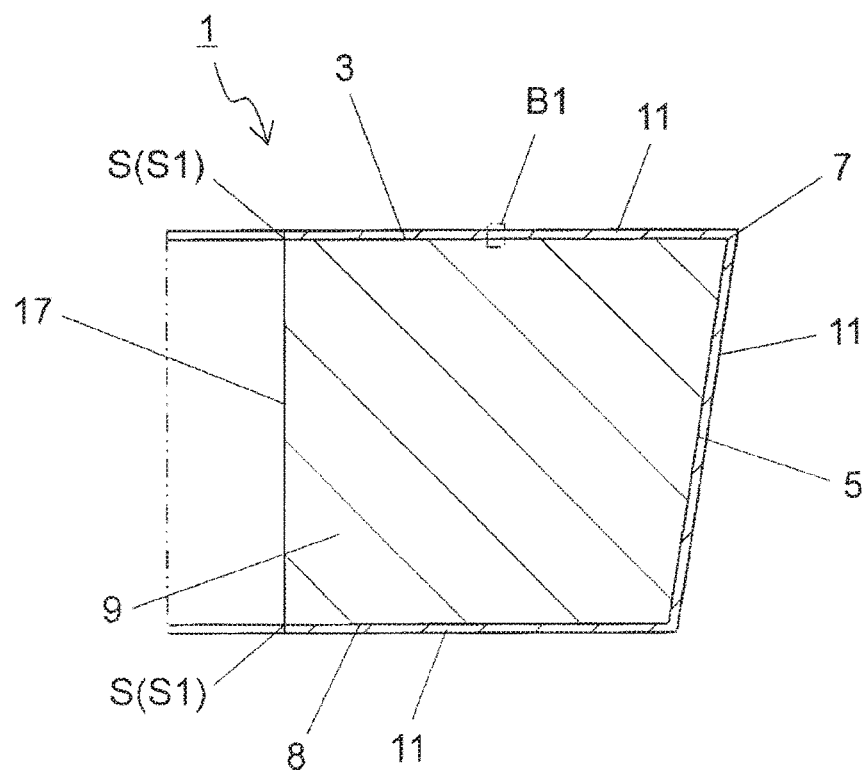
FIG. 2 is a sectional view taken along line A-A in the coated tool illustrated in FIG. 1.

As illustrated in FIGS. 1 and 2, the coated tool 1 includes a base member 9 having a quadrangular plate shape, and the coating layer 11 that coats a surface of the base member 9 in the first non-limiting embodiment. The coating layer 11 may cover the whole or only a part of the surface of the base member 9. If the coating layer 11 covers only the part of the base member 9, it can be said that the coating layer 11 is located on at least the part of the base member 9.

A thickness of the coating layer 11 is settable to, for example, approximately 0.1-10 μm. The thickness of the coating layer 11 may be constant or may be changed depending on location.

Figure 3:
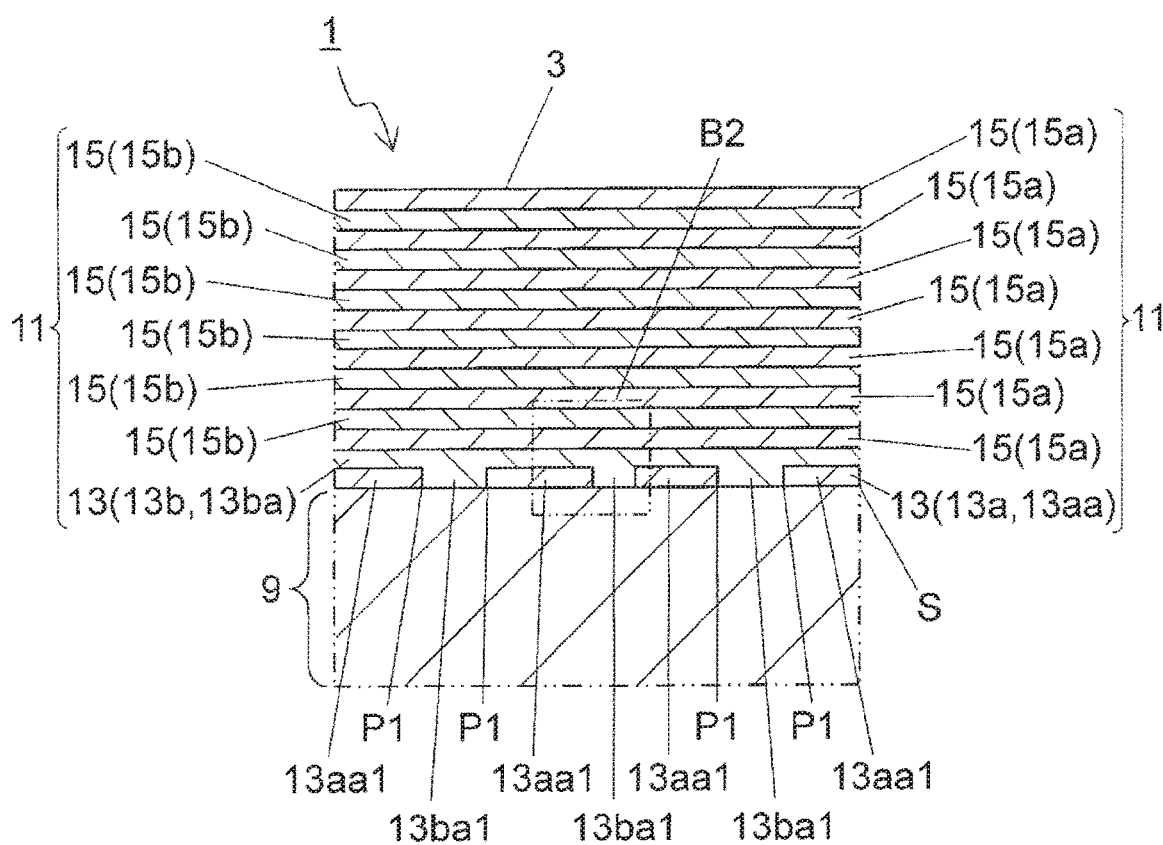
FIG. 3 is an enlarged view of a region B1 illustrated in FIG. 2.

As illustrated in FIG. 3, the coating layer 11 includes a first section 13 located on the base member 9 and a second section 15 located on the first section 13. The first section 13 includes an AlTi portion 13a including aluminum (Al) and titanium (Ti), and an AlCr portion 13b including aluminum and chromium (Cr).

The second section 15 includes a plurality of AlTi layers 15a including aluminum and titanium, and a plurality of AlCr layers 15b including aluminum and chromium. The plurality of AlTi layers 15a and the plurality of AlCr layers 15b are located alternately one upon another in the second section 15. In other words, the second section 15 has a configuration in which the plurality of AlTi layers 15a and the plurality of AlCr layers 15b are laminated alternately one upon another. A laminate structure of the coating layer 11 is evaluable by cross section measurement using a scanning electron microscopy (SEM) or transmission electron microscopy (TEM).

The AlTi portion 13a and the AlTi layer 15a may be composed of only aluminum and titanium, respectively, and may include a metal component, such as Si, Nb, Hf, V, Ta, Mo, Zr, Cr, W, and Co, in addition to aluminum and titanium. A sum of content ratios of aluminum and titanium is higher than that of the metal component in the AlTi portion 13a and the AlTi layer 15a. A content ratio of aluminum is settable to, for example, 40-70%. A content ratio of titanium is settable to, for example, 25-55%. The term "content ratio" indicates a content ratio in terms of atomic ratio.

The content ratio of aluminum may be higher than the content ratio of titanium in each of the AlTi portion 13a and the plurality of AlTi layers 15a. Alternatively, the content ratio of titanium may be higher than the content ratio of aluminum in each of the AlTi portion 13a and the plurality of AlTi layers 15a.

The AlTi portion 13a and the AlTi layer 15a may be composed of only a metal component including aluminum and titanium. Alternatively aluminum and titanium may be a nitride, carbide, or carbonitride including one or a plurality of them.

The AlCr portion 13b and the AlCr layer 15b may be composed of only aluminum and chromium, or alternatively, may include a metal component, such as Si, Nb, Hf, V, Ta, Mo, Zr, Ti, W, and Co, in addition to aluminum and chromium. A sum of content ratios of aluminum and chromium is higher than that of the metal component in the AlCr portion 13b and the AlCr layer 15b. The content ratio of aluminum is settable to, for example, 20-60%. The content ratio of chromium is settable to, for example, 40-80%.

The content ratio of aluminum may be higher than the content ratio of chromium in each of the AlCr portion 13b and the plurality of AlCr layers 15b. Alternatively, the content ratio of chromium may be higher than the content ratio of aluminum in each of the AlCr portion 13b and the plurality of AlCr layers 15b.

The AlCr portion 13b and the AlCr layer 15b may be composed only of a metal component including aluminum and chromium. Alternatively, aluminum and chromium may be a nitride, carbide, or carbonitride of metal components including one or all of them.

Compositions of the AlTi portion 13a, the AlCr portion 13b, the AlTi layer 15a, and the AlCr layer 15b are measurable using, for example, energy dispersive X-ray spectroscopy (EDS) or X-ray photoelectron spectroscopy (XPS).

The number of the AlTi layer 15a and the number of the AlCr layer 15b are not limited to a specific value. The number of the AlTi layer 15a and the number of the AlCr layer 15b may be individually two or more, and are settable to, for example, 2 to 500.

Since the coating layer 11 includes the AlTi portion 13a and the AlTi layer 15a, it has high fracture resistance. Since the coating layer 11 includes the AlCr portion 13b and the AlCr layer 15b, it has high wear resistance. Strength of the coating layer 11 is high as a whole since the second section 15 has a configuration in which the plurality of AlTi layers 15a and the plurality of AlCr layers 15b are located alternately one upon another.

Strength of the coating layer 11 is high as a whole in the case where the thickness of each of the plurality of AlTi layers 15a and the plurality of AlCr layers 15b is small and the number of the plurality of AlTi layers 15a and the plurality of AlCr layers 15b is large, as compared with the case where the thickness of each of the plurality of AlTi layers 15a and the plurality of AlCr layers 15b is large and the number of the plurality of AlTi layers 15a and the plurality of AlCr layers 15b is small.

The thicknesses of the AlTi portion 13a, the AlCr portion 13b, the AlTi layer 15a, and the AlCr layer 15b are not limited to a specific value, but are settable to 5-100 nm each. The thicknesses of the plurality of AlTi layers 15a and the plurality of AlCr layers 15b may be constant or may be different from each other.

Figure 4:
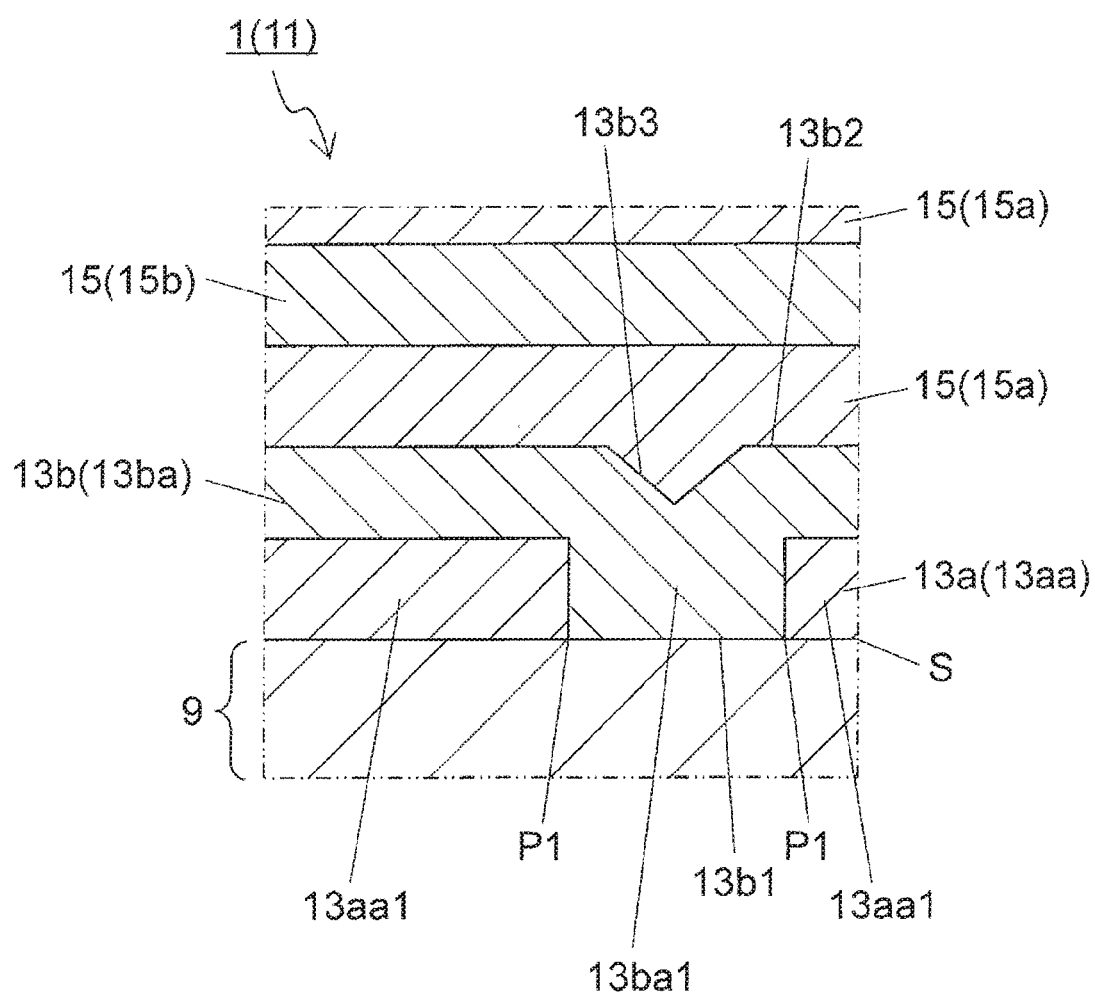
FIG. 4 is an enlarged view of a region B2 illustrated in FIG. 3.

The first section 13 in the first non-limiting embodiment includes a first AlTi portion 13aa, as illustrated in FIGS. 3 and 4. The first section 13 in the first non-limiting embodiment includes a first AlCr portion 13ba. Each of the first AlTi portion 13aa and the first AlCr portion 13ba is in contact with the base member 9. The coated tool 1 satisfying these configurations is excellent in durability.

When only one of the AlTi portion 13a and the AlCr portion 13b is in contact with the base member 9, for example, there is a large residual stress at an interface S between the base member 9 and the coating layer 11. When a crack occurs at an outer peripheral end S1 (see FIG. 2), the crack is likely to develop, and the coating layer 11 may be separated from the base member 9.

In the first non-limiting embodiment, each of the first AlTi portion 13aa and the first AlCr portion 13ba is in contact with the base member 9. Therefore, even if a crack occurs at the outer peripheral end S1 of the interface S between the base member 9 and the coating layer 11, it is easy to suppress the development of the crack at a portion P1 where the boundary between the first AlTi portion 13aa and the first AlCr portion 13ba is located.

Thereby, the joinability (adhesion) between the base member 9 and the coating layer 11 is high, and the possibility that the coating layer 11 is separated from the base member 9 can be reduced. Therefore, the coated tool 1 in the first non-limiting embodiment is excellent in durability. The coated tool 1 in the first non-limiting embodiment is therefore capable of carrying out a cutting process that is stable over a long term.

The phrase that each of the first AlTi portion 13aa and the first AlCr portion 13ba is in contact with the base member 9 means that each of the first AlTi portion 13aa and the first AlCr portion 13ba is substantially in contact with the base member 9. Specifically, that each of the first AlTi portion 13aa and the first AlCr portion 13ba is in contact with the base member 9 is only required to be that at least 5% of the region is in contact with the base member 9, of the surfaces of the first AlTi portion 13aa and the first AlCr portion 13ba facing the base member 9 respectively.

The first AlTi portion 13aa may be in contact with the base member 9 in a plurality of regions 13aa1 separated from one another. When such a configuration is satisfied, the number of the portions P1 can be increased, so that the effect of suppressing the development of cracks is high. The number of the regions 13aa1 may be two or more, and is settable to, for example, 2 to 20000.

In particular, when the number of the regions 13aa1 per 1 $\mu m^2$ is 10 to 50, the effect of suppressing the development of cracks can be further enhanced. Further, also in the case where the number of the regions 13aa1 per 1 μm in a direction orthogonal to a thickness direction of the coating layer 11 is 3 to 7 in a cross section orthogonal to the surface of the coating layer 11, the effect of suppressing the development of cracks can be further enhanced.

In particular, when the first section 13 includes the plurality of first AlTi portions 13aa located separately from one another, and each of the first AlTi portions 13aa is in contact with the base member 9, the development of cracks is more easily suppressed in the portion P1 where the boundary between the first AlTi portion 13aa and the first AlCr portion 13ba is located. This is because the plurality of first AlTi portions 13aa are located separately from one another, the first AlTi portions 13aa are easily deformed, so that the residual stress can be reduced. As a result, cracks are less likely to occur, so that it is easier to further suppress the development of cracks.

The first AlCr portion 13ba may be in contact with the base member 9 in a plurality of regions 13ba1 separated from one another. When such a configuration is satisfied, the number of the portions P1 can be increased, so that the effect of suppressing the development of cracks is high. The number of the regions 13ba1 may be two or more, and is settable to, for example, 2 to 20000.

In particular, when the number of the regions 13ba1 per 1 $\mu m^2$ is 10 to 50, the effect of suppressing the development of cracks can be further enhanced. Further, also in the case where the number of the regions 13ba1 per 1 μm in the direction orthogonal to the thickness direction of the coating layer 11 is 3 to 7 in the cross section orthogonal to the surface of the coating layer 11, the effect of suppressing the development of cracks can be further enhanced.

In particular, when the first section 13 includes the plurality of first AlCr portions 13ba located separately from one another, and each of the first AlCr portions 13ba is in contact with the base member 9, the development of cracks is more easily suppressed in the portion P1 where the boundary between the first AlTi portion 13aa and the first AlCr portion 13ba is located. This is because the plurality of first AlCr portions 13ba are located separately from one another, the first AlCr portions 13ba are easily deformed, so that the residual stress can be reduced. As a result, cracks are less likely to occur, so that it is easier to further suppress the development of cracks.

The base member 9 may include a first phase including tungsten carbide (WC) as a main component and a second phase including cobalt (Co) as a main component. The first phase including tungsten carbide as a main component is generally called a hard phase. The second phase including cobalt as a main component is generally called a binding phase since cobalt has a function of binding a plurality of first phases.

The first AlTi portion 13aa and the first AlCr portion 13ba may be in contact with only one of the first phase and the second phase in the base member 9, or may be in contact with both the first phase and the second phase. In particular, when the first AlTi portion 13aa and the first AlCr portion 13ba are in contact with the second phase, which is also referred to as a binding phase, the joinability between the first AlTi portion 13aa and the base member 9, and between the first AlCr portion 13ba and the base member 9 is high.

The phrase that the first phase includes tungsten carbide as a main component means that the first phase includes tungsten carbide at a higher ratio than components other than tungsten carbide. Similarly, the phrase that the second phase includes cobalt as a main component means that the second phase includes cobalt at a higher ratio than components other than cobalt. The specific material of the base member 9 will be described later in detail.

The first AlTi portion 13aa and the first AlCr portion 13ba may include cobalt. When such a configuration is satisfied, the joinability between the first AlTi portion 13aa and the base member 9, and between the first AlCr portion 13ba and the base member 9 is high. The content ratio of cobalt in the first AlTi portion 13aa and the first AlCr portion 13ba is not limited to a specific value, but is settable to, for example, 0.1 to 20% each.

The content ratio of cobalt in the first AlTi portion 13aa and the first AlCr portion 13ba may be higher than the content ratio of cobalt in the plurality of AlTi layers 15a and the AlCr layers 15b.

When the first AlTi portion 13aa and the first AlCr portion 13ba satisfy the above-described configuration, an influence on the fracture resistance of the AlTi layer 15a and the wear resistance of the AlCr layer 15b in the second section 15 can be reduced, while improving the joinability between the first section 13 and the base member 9. The content ratio of cobalt in the plurality of AlTi layers 15a and the AlCr layers 15b is not limited to a specific value, but is settable to, for example, 0.1 to 15% each.

There is no problem if any one of the contact area between the first AlTi portion 13aa and the base member 9 and the contact area between the first AlCr portion 13ba and the base member 9 is larger than the other. When the contact area between the first AlTi portion 13aa and the base member 9 is larger than the contact area between the first AlCr portion 13ba and the base member 9, the joinability between the base member 9 and the coating layer 11 is high.

As illustrated in FIG. 4, the first AlCr portion 13ba may include an inner side surface 13b1 located on the side of the base member 9, an outer side surface 13b2 located on the opposite side to the inner side surface 13b1, and a recess portion 13b3 located on the outer side surface 13b2. At this time, the recess portion 13b3 may be located above a portion of the inner side surface 13b1 that is in contact with the base member 9. When these configurations are satisfied, the variation in the thickness of the first AlCr portion 13ba can be suppressed. Therefore, since the variation in the strength of the first AlCr portion 13ba is suppressed, the distortion of the residual stress in the first AlCr portion 13ba is reduced, and the durability of the first AlCr portion 13ba is enhanced.

The number of the recess portions 13b3 is not limited to a specific value. The number of the recess portions 13b3 is settable to, for example, 10 to 50 per 1 pmt.

Although the coated tool 1 has the quadrangular plate shape as illustrated in FIG. 1 in the first non-limiting embodiment, the shape of the coated tool 1 is not limited thereto. There is no problem even if the first surface 3 and the third surface 8 may have, for example, a triangular shape, a hexagonal shape or a circular shape instead of the quadrangular shape.

The coated tool 1 includes a through hole 17 in the first non-limiting embodiment as illustrated in FIG. 1. The through hole 17 is extended from the first surface 3 to the third surface 8 located on an opposite side of the first surface 3 in the first non-limiting embodiment, and the through hole 17 opens into these surfaces. The through hole 17 is usable for attaching a screw or clamping member when the coated tool 1 is held onto a holder. There is no problem even if the through hole 17 opens into regions located on opposite sides in the second surface 5.

Examples of material of the base member 9 include inorganic materials, such as cemented carbide, cermet and ceramics. Examples of composition of cemented carbide include WC (tungsten carbide)-Co, WC—TiC (titanium carbide)-Co and WC—TiC—TaC (tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride). The material of the base member 9 is not limited to these materials.

The coating layer 11 can be located on the base member 9 by using, for example, physical vapor deposition (PVD) method. In cases where the coating layer 11 is deposited with the base member 9 held on an inner peripheral surface of the through hole 17 by using the above vapor deposition method, the coating layer 11 can be located so as to cover the entirety of the surface of the base member 9 except for the inner peripheral surface of the through hole 17.

Examples of the physical vapor deposition method include ion plating method and sputtering method. As one example of the deposition with the ion plating method, the coating layer 11 can be deposited with the following method.

In a first procedure, a metal target independently including aluminum and titanium, a composite alloy target or a sintered body target is prepared. The above target serving as a metal source is vaporized and ionized by an arc discharge and a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9. The AlTi portion 13a and the AlTi layer 15a are formable through the above procedure.

In a second procedure, a metal target independently including aluminum and chromium, a composite alloy target or a sintered body target is prepared. The above target serving as a metal source is vaporized and ionized by an arc discharge and a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9. The AlCr portion 13b and the AlCr layer 15b are formable through the above procedure.

The coating layer 11 including the first section 13 including the AlTi portion 13a and the AlCr portion 13b, and the second section 15 including the plurality of AlTi layers 15a and the plurality of AlCr layers 15b is formable by alternately repeating the first procedure and the second procedure. There is no problem even if the first procedure is carried out after the second procedure.

When the first procedure and the second procedure are alternately repeated, it is possible to manufacture the first section 13 including the AlTi portion 13a and the AlCr portion 13b by appropriately adjusting each condition in the first procedure and the second procedure such that each of the first AlTi portion 13aa and the first AlCr portion 13ba is in contact with the base member 9.

Further, for example, the first procedure may be performed first after performing masking so as to cover a part of the surface of the base member 9, and then the second procedure may be performed first after removing the masking. The first section 13 including the AlTi portion 13a and the AlCr portion 13b can be manufactured by such a procedure.

Second Non-Limiting Embodiment

A coated tool in a second non-limiting embodiment of the present disclosure is described below in detail with reference to the drawings. The following description is mainly focused on differences from the first non-limiting embodiment. Therefore, the descriptions in the first non-limiting embodiment are applicable to descriptions of configurations similar to those in the first non-limiting embodiment, and the corresponding descriptions are omitted here.

In the coated tool 1 of the first non-limiting embodiment, each of the AlTi portion 13a and the AlCr portion 13b of the first section 13 is in contact with the base member 9 along a direction orthogonal to a laminating direction of the AlTi layer 15a and the AlCr layer 15b in the second section 15 (right-left direction in FIG. 3). On the other hand, in a coated tool 20 of the second non-limiting embodiment, each of the AlTi portion 13a and the AlCr portion 13b of the first section 13 is in contact with the base member 9 along the laminating direction of the AlTi layer 15a and the AlCr layer 15b in the second section 15 (up-down direction in FIG. 3).

Figure 5:
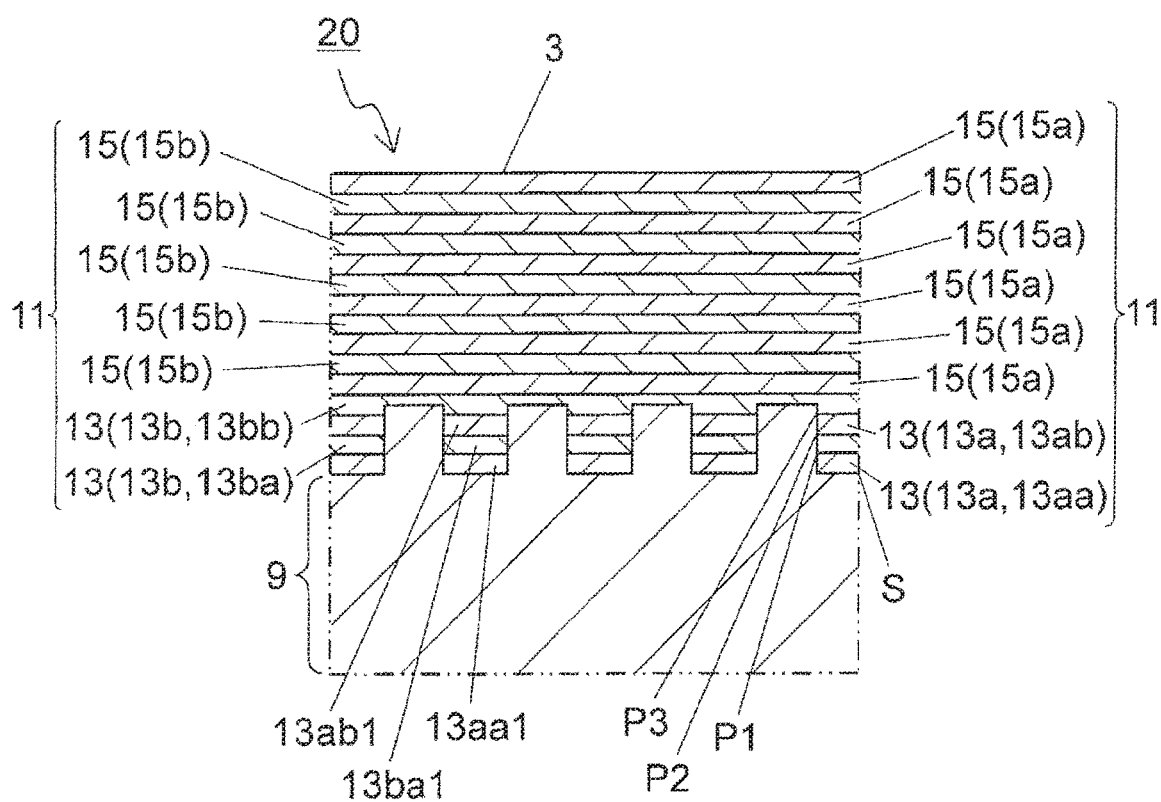
FIG. 5 is a diagram illustrating a coated tool in a second non-limiting embodiment of the present disclosure, which corresponds to FIG. 3 in the first non-limiting embodiment.

In the non-limiting embodiment illustrated in FIG. 5, the first section 13 further includes, in addition to the first AlTi portion 13aa, a second AlTi portion 13ab located above the first AlTi portion 13aa in the laminating direction of the second section 15. Furthermore, the first section 13 further includes, in addition to the first AlCr portion 13ba, a second AlCr portion 13bb located above the first AlCr portion 13ba in the laminating direction of the second section 15. At this time, each of the second AlTi portion 13ab and the second AlCr portion 13bb is in contact with the base member 9. If these configurations are satisfied, the coated tool 20 has excellent durability as described later.

In the second non-limiting embodiment, each of the second AlTi portion 13ab and the second AlCr portion 13bb is in contact with the base member 9. Therefore, even if a crack occurs at the outer peripheral end S1 of the interface S between the base member 9 and the coating layer 11 (see FIG. 2), in addition to the portion P1 where the boundary between the first AlTi portion 13aa and the first AlCr portion 13ba is located, the development of cracks can be suppressed also in a portion P2 where the boundary between the first AlCr portion 13ba and the second AlTi portion 13ab is located and in a portion P3 where the boundary between the second AlTi portion 13ab and the second AlCr portion 13bb is located. Therefore, the joinability between the base member 9 and the coating layer 11 can be enhanced, and the possibility that the coating layer 11 is separated from the base member 9 can be reduced. Therefore, the coated tool 20 of the second non-limiting embodiment is excellent in durability.

That each of the second AlTi portion 13*ab* and the second AlCr portion 13*bb* is in contact with the base member 9 can be defined similarly to that each of the first AlTi portion 13*aa* and the first AlCr portion 13*ba* is in contact with the base member 9. Furthermore, when the first procedure and the second procedure are alternately repeated in the above ion plating method, by appropriately adjusting each condition in the first procedure and the second procedure such that each of the second AlTi portion 13*ab* and the second AlCr portion 13*bb* is in contact with the base member 9, it is possible to manufacture the plurality of AlTi portions 13*a* further including the second AlTi portions 13*ab* and the plurality of AlCr portions 13*b* further including the second AlCr portion 13*bb*.

The second AlTi portion 13*ab* may be in contact with the base member 9 in a plurality of regions 13*ab*1 separated from one another. When such a configuration is satisfied, the number of the portions P2 and the portions P3 can be increased, so that the effect of suppressing the development of cracks can be enhanced. The number of the regions 13*ab*1 may be two or more, and is settable to, for example, 2 to 10000.

In particular, when the number of the regions 13*ab*1 per 1 $\mu m^2$ is 2 to 20, the effect of suppressing the development of cracks can be further enhanced. Further, also in the case where the number of the regions 13*ab*1 per 1 μm in the direction orthogonal to the thickness direction of the coating layer 11 is 2 to 5 in the cross section orthogonal to the surface of the coating layer 11, the effect of suppressing the development of cracks can be further enhanced.

<Cutting Tool>

Cutting tools in various non-limiting embodiments of the present disclosure are described below with reference to the drawings.

Figure 6:
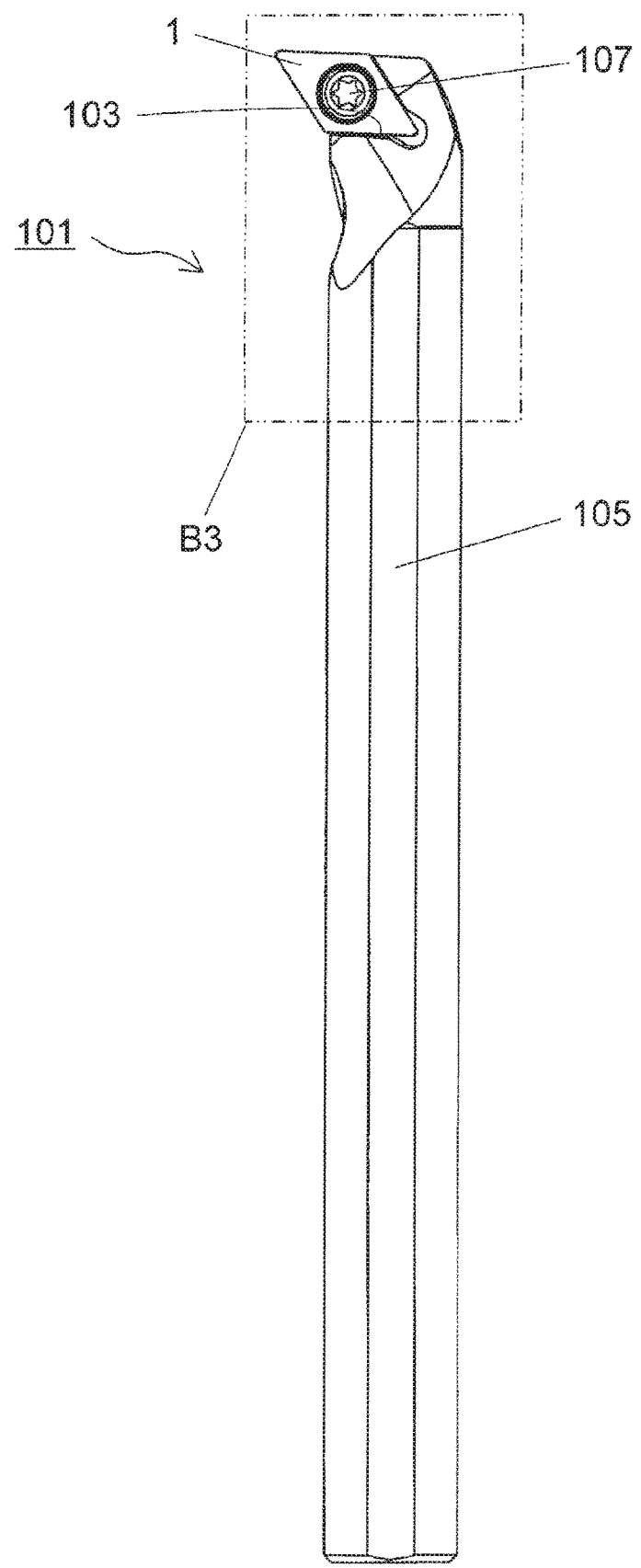
FIG. 6 is a plan view illustrating a cutting tool in a non-limiting embodiment of the present disclosure.
Figure 7:
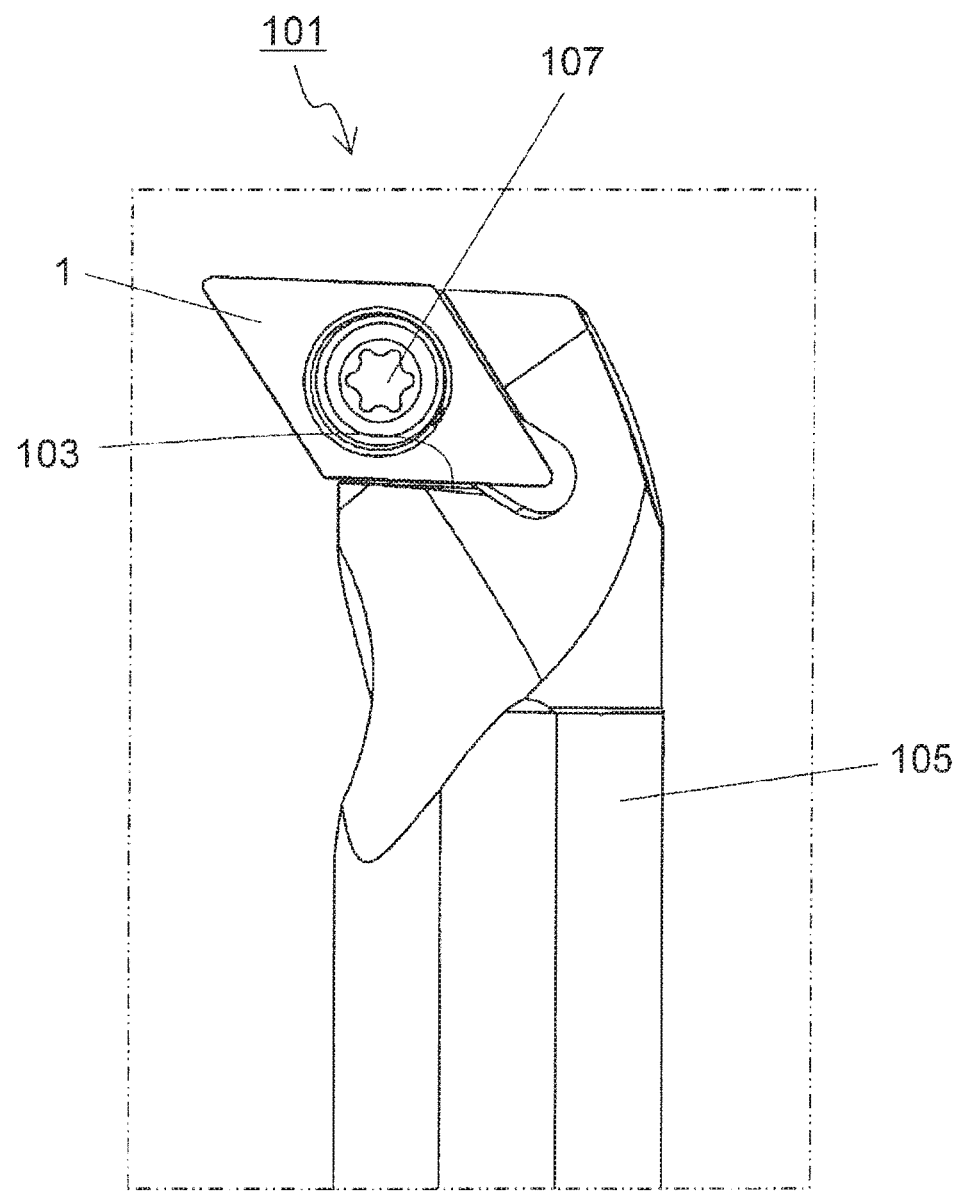
FIG. 7 is an enlarged view of a region B3 illustrated in FIG. 6.

As illustrated in FIG. 6, a cutting tool 101 in a non-limiting embodiment is a bar-shaped body extended from a first end (an upper end in FIG. 6) to a second end (a lower end in FIG. 6). As illustrated in FIG. 7, the cutting tool 101 includes a holder 105 with a pocket 103 located at a side of the first end (front end), and the coated tool 1 according to the first non-limiting embodiment located in the pocket 103. The cutting tool 101 including the coated tool 1 is capable of carrying out a cutting process that is stable over a long term.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached such that at least a part of a ridge line where the first surface 3 intersects with the second surface 5, which is usable as the cutting edge 7, is protruded outward from the holder 105. The coated tool 1 is attached to the holder 105 by a fixing screw 107 in a non-limiting embodiment. Specifically, the coated tool 1 is attachable to the holder 105 in such a manner that screw parts are engaged with each other by inserting the fixing screw 107 into the through hole 17 of the coated tool 1, and by inserting a front end of the fixing screw 107 into a screw hole (not illustrated) formed in the pocket 103.

For example, steel and cast iron are usable as a material of the holder 105. Of these materials, as an example, high toughness steel may be used.

The various non-limiting embodiments have illustrated and described the cutting tools for use in the so-called turning process. Examples of the turning process include inner diameter processing, outer diameter processing and grooving process. The cutting tools are not limited to ones which are used for the turning process. For example, the coated tools 1 of the above non-limiting embodiments are applicable to the cutting tools for use in a milling process.

The cutting tool 101 in the above non-limiting embodiment has been described by taking the case of using the coated tool 1 as a non-limiting embodiment. The coated tool 20 in the second non-limiting embodiment may be used instead of the coated tool 1.

Singular forms "a", "an" and "the" in the entirety of the present disclosure include plural forms thereof unless clearly indicated not being so from the context.

DESCRIPTION OF THE REFERENCE NUMERALS

1: Coated tool
3: First surface
3*a*: Rake surface region
5: Second surface
5*a*: Flank surface region
7: Cutting edge
8: Third surface
9: Base member
11: Coating layer
13: First section
13*a*: AlTi portion
13*aa*: First AlTi portion
13*aa*1: Region
13*ab*: Second AlTi portion
13*ab*1: Region
13*b*: AlCr portion
13*ba*: First AlCr portion
13*ba*1: Region
13*b*1: Inner side surface
13*b*2: Outer side surface
13*b*3: Recess portion
13*bb*: Second AlCr portion
15: Second section
15*a*: AlTi layer
15*b*: AlCr layer
17: Through hole
20: Coated tool
101: Cutting tool
103: Pocket
105: Holder
107: Fixing screw

What is claimed is:

1. A coated tool, comprising:
a base member; and
a coating layer located on the base member, wherein
the coating layer comprises a first section located on the base member and a second section located on the first section;
the first section comprises an AlTi portion comprising aluminum and titanium, and an AlCr portion comprising aluminum and chromium, and each of the AlTi portion and the AlCr portion is in contact with the base member; and the second section comprises a plurality of AlTi layers comprising aluminum and titanium, and a plurality of AlCr layers comprising aluminum and chromium, respective AlTi layers of the plurality of AlTi layers and respective AlCr layers of the plurality of AlCr layers are located alternately one upon another.

2. The coated tool according to claim 1, wherein the AlTi portion is in contact with the base member in a plurality of regions separated from one another.

3. The coated tool according to claim 2, wherein the first section comprises a plurality of the AlTi portions located separated from one another.

4. The coated tool according to claim 1, wherein the AlCr portion is in contact with the base member in a plurality of regions separated from one another.

5. The coated tool according to claim 4, wherein the first section comprises a plurality of the AlCr portions located separated from one another.

6. The coated tool according to claim 1, wherein the base member comprises a first phase comprising tungsten carbide as a main component and a second phase comprising cobalt as a main component, and each of the AlTi portion and the AlCr portion is in contact with the second phase.

7. The coated tool according to claim 6, wherein each of the AlTi portion and the AlCr portion further comprises cobalt.

8. The coated tool according to claim 6, wherein a content ratio of cobalt in the AlTi portion and the AlCr portion is higher than a content ratio of cobalt in the plurality of AlTi layers and the plurality of AlCr layers.

9. A cutting tool, comprising:
a holder comprising a pocket located at a side of a front end of the holder; and the coated tool according to claim 1, which is located in the pocket.

* * * * *